(12) United States Patent  
Liu

(10) Patent No.: US 11,487,145 B2  
(45) Date of Patent: Nov. 1, 2022

(54) DISPLAY PANEL, MASK FOR MANUFACTURING SAME, AND DISPLAY DEVICE

(71) Applicant: HKC CORPORATION LIMITED, Shenzhen (CN)

(72) Inventor: Zhongnian Liu, Chongqing (CN)

(73) Assignee: HKC CORPORATION LIMITED, Shenzhen (CN)

( * ) Notice: Subject to any disclaimer, the term of this patent is extended or adjusted under 35 U.S.C. 154(b) by 340 days.

(21) Appl. No.: 16/349,601

(22) PCT Filed: Nov. 29, 2018

(86) PCT No.: PCT/CN2018/118043  
§ 371 (c)(1),  
(2) Date: May 13, 2019

(87) PCT Pub. No.: WO2020/097990  
PCT Pub. Date: May 22, 2020

(65) Prior Publication Data  
US 2020/0292873 A1  Sep. 17, 2020

(30) Foreign Application Priority Data

Nov. 12, 2018 (CN) .......................... 201811337203.4

(51) Int. Cl.  
*G02F 1/1333* (2006.01)  
*G02F 1/1335* (2006.01)  
*G02F 1/1339* (2006.01)

(52) U.S. Cl.  
CPC .... *G02F 1/133382* (2013.01); *G02F 1/13394* (2013.01); *G02F 1/133512* (2013.01); *G02F 1/13396* (2021.01); *G02F 1/133368* (2021.01)

(58) Field of Classification Search  
CPC ......... G02F 1/133382; G02F 1/133512; G02F 1/13394; G02F 2001/133368; G02F 2001/13396  
See application file for complete search history.

(56) References Cited

U.S. PATENT DOCUMENTS

2010/0065850 A1* 3/2010 Kwak ............... G02F 1/136227  
257/72  
2017/0299918 A1* 10/2017 Yu ......................... G02F 1/1368

FOREIGN PATENT DOCUMENTS

CN 101329481 A 12/2008  
CN 101382732 A  3/2009  
(Continued)

OTHER PUBLICATIONS

International Search Report issued in corresponding international application No. PCT/CN2018/118043, dated Jul. 31, 2019 (8 pages).

(Continued)

*Primary Examiner* — Nathanael R Briggs

(57) ABSTRACT

This application discloses a display panel, a mask for manufacturing same, and a display device. The display panel includes a first substrate, a second substrate, a liquid crystal layer, a plurality of grooves, and a spacer. The second substrate and the first substrate are arranged oppositely. The liquid crystal layer is formed between the first substrate and the second substrate. The plurality of grooves are provided on the first substrate and depressed from the surface of the first substrate. The spacer is formed on the first substrate and arranged between the first substrate and the second substrate. The spacer includes a main spacer and sub-spacers, the main spacer being higher than the sub-spacers, and the sub-spacers being located inside the grooves.

5 Claims, 5 Drawing Sheets

(56) References Cited

FOREIGN PATENT DOCUMENTS

| | | |
|---|---|---|
| CN | 101425565 A | 5/2009 |
| CN | 101452158 A | 6/2009 |
| CN | 103149741 A | 6/2013 |
| CN | 103852969 A | 6/2014 |
| CN | 104133325 A | 11/2014 |
| CN | 104298010 A | 1/2015 |
| CN | 104423084 A | 3/2015 |
| CN | 105204104 A | 12/2015 |
| CN | 105274490 A | 1/2016 |
| CN | 105652527 A | 6/2016 |
| CN | 105676547 A | 6/2016 |
| CN | 106292042 A | 1/2017 |
| CN | 206133181 U | 4/2017 |
| CN | 106681101 A | 5/2017 |
| CN | 106773351 A | 5/2017 |
| CN | 106873252 A | 6/2017 |
| CN | 107238980 A | 10/2017 |
| CN | 107608126 A | 1/2018 |
| CN | 107741673 A | 2/2018 |
| JP | 2005326887 A | 11/2005 |
| KR | 20070105457 A | 10/2007 |
| KR | 20080032852 A | 4/2008 |
| KR | 20080082718 A | 9/2008 |
| TW | 201324001 A | 6/2013 |

OTHER PUBLICATIONS

First Office Action from China patent office in a counterpart Chinese patent Application 201811337203.4, dated Mar. 25, 2020 (7 pages).
Written Opinion of the International Searching Authority for No. PCT/CN2018/118043.

* cited by examiner

DISPLAY PANEL, MASK FOR MANUFACTURING SAME, AND DISPLAY DEVICE

This application claims the priority to the Chinese Patent Application No. CN201811337203.4, filed with National Intellectual Property Administration, PRC on Nov. 12, 2018 and entitled "DISPLAY PANEL, MASK FOR MANUFACTURING SAME, AND DISPLAY DEVICE", which is incorporated herein by reference in its entirety.

TECHNICAL FIELD

This application relates to the technical field of display, and more particularly to a display panel, a mask for manufacturing same, and a display device.

BACKGROUND

The description herein provides only background information related to this application, but does not necessarily constitute the existing technology.

A cell gap of a thin film transistor liquid crystal display (TFT-LCD) is determined by the amount of liquid crystals injected therein, and the volume of liquid crystals may be affected by an environment temperature. When the volume of liquid crystals is increased due to a high temperature, a liquid crystal cell is prone to gravity display brightness mura. When the volume of liquid crystals shrinks due to a low temperature, vacuum bubbles are easily generated in the liquid crystal cell. In the liquid crystal cell, there are two photo spacers (PS), namely a main PS maintaining the gap of the liquid crystal cell under normal circumstances, and a sub-PS playing a supporting role only when being extruded by an external force.

The small liquid crystal redundancy of the liquid crystal cell results in gravity display brightness mura of the liquid crystal cell in case of a temperature variation.

SUMMARY

This application is directed to a display panel, a mask for manufacturing same, and a display device, intended to alleviate the gravity display brightness mura of a liquid crystal cell due to a temperature variation.

To this end, this application provides a display panel. The display panel includes a first substrate, a second substrate, a liquid crystal layer, a plurality of grooves, and a spacer. The second substrate and the first substrate are arranged oppositely. The liquid crystal layer is formed between the first substrate and the second substrate. The plurality of grooves are formed on the first substrate and depressed from the surface of the first substrate. The spacer is formed on the first substrate and arranged between the first substrate and the second substrate. The spacer includes a main spacer and sub-spacers, the main spacer being higher than the sub-spacers, and the sub-spacers being located inside the grooves.

Optionally, the first substrate includes a black matrix layer, the grooves being provided on the black matrix layer.

Optionally, the first substrate includes a photoresist layer, the grooves being provided on the photoresist layer.

Optionally, the first substrate includes a black matrix layer, the black matrix layer being provided with a photoresist layer, and the grooves being provided in an overlap region of the black matrix layer and the photoresist layer.

Optionally, the photoresist layer includes a red photoresist layer, a green photoresist layer and a blue photoresist layer, the grooves being provided on the red photoresist layer and the green photoresist layer.

This application also provides a mask for manufacturing a display panel, comprising: a photic zone; and a shading zone, avoiding from the photic zone, the shading zone comprising a first shading zone and a second shading zone, the first shading zone being in positional correspondence with a groove, and the light transmittance of the first shading zone being greater than the light transmittance of the second shading zone.

Optionally, the first shading zone is made of a partially-photic mask.

Optionally, the first shading zone is made of a hollowed-out metal layer.

Optionally, the metal layer is strip-shaped.

Optionally, the metal layer is mesh-shaped.

Optionally, the width of each hollowed-out grid in the metal layer is greater than or equal to 1 μm.

Optionally, the width of each hollowed-out grid in the metal layer is less than or equal to 3 μm.

Optionally, the metal layer is made of chromium.

Optionally, the metal layer is made of chromium oxide.

Optionally, the metal layer is made of molybdenum silicide.

Optionally, the metal layer is made of a nitrogen-containing zirconium silicide or nitrogen-containing molybdenum silicide material.

This application also provides a display device. The display device includes a display panel. The display panel includes a first substrate, a second substrate, a liquid crystal layer, a plurality of grooves, and a spacer. The second substrate and the first substrate are arranged oppositely. The liquid crystal layer is formed between the first substrate and the second substrate. The plurality of grooves are formed on the first substrate and depressed from the surface of the first substrate. The spacer is formed on the first substrate and arranged between the first substrate and the second substrate. The spacer includes a main spacer and sub-spacers, the main spacer being higher than the sub-spacers, and the sub-spacers being located inside the grooves.

Compared with a scheme for alleviating the temperature influence on the gap of a liquid crystal cell, this application may increase a segment gap between a main spacer and sub-spacers in order to increase the liquid crystal redundancy of a liquid crystal cell in view of the fact that a spacer affects the liquid crystal cell, the main spacer maintains the gap of the liquid crystal cell and the sub-spacers also play a supporting role during extrusion by an external force. Therefore, according to this scheme, grooves are provided under the sub-spacers, so that the sub-spacers are fixed into the grooves to make the segment gap with respect to the main spacer increased, thus increasing the liquid crystal redundancy of the liquid crystal cell, and improving the phenomenon of gravity display brightness mura of the liquid crystal cell due to a temperature variation.

BRIEF DESCRIPTION OF DRAWINGS

The accompanying drawings included are used for helping understand the embodiments of this application, constitute a part of this specification, illustrate examples of the embodiments of this application and, together with the description, serve to explain the principles of this application. Apparently, the accompanying drawings in the following description merely show some embodiments of this application, and persons of ordinary skill in the art may still derive other drawings four these accompanying drawings without creative effort. In the figures.

DETAILED DESCRIPTION

Figure 1:
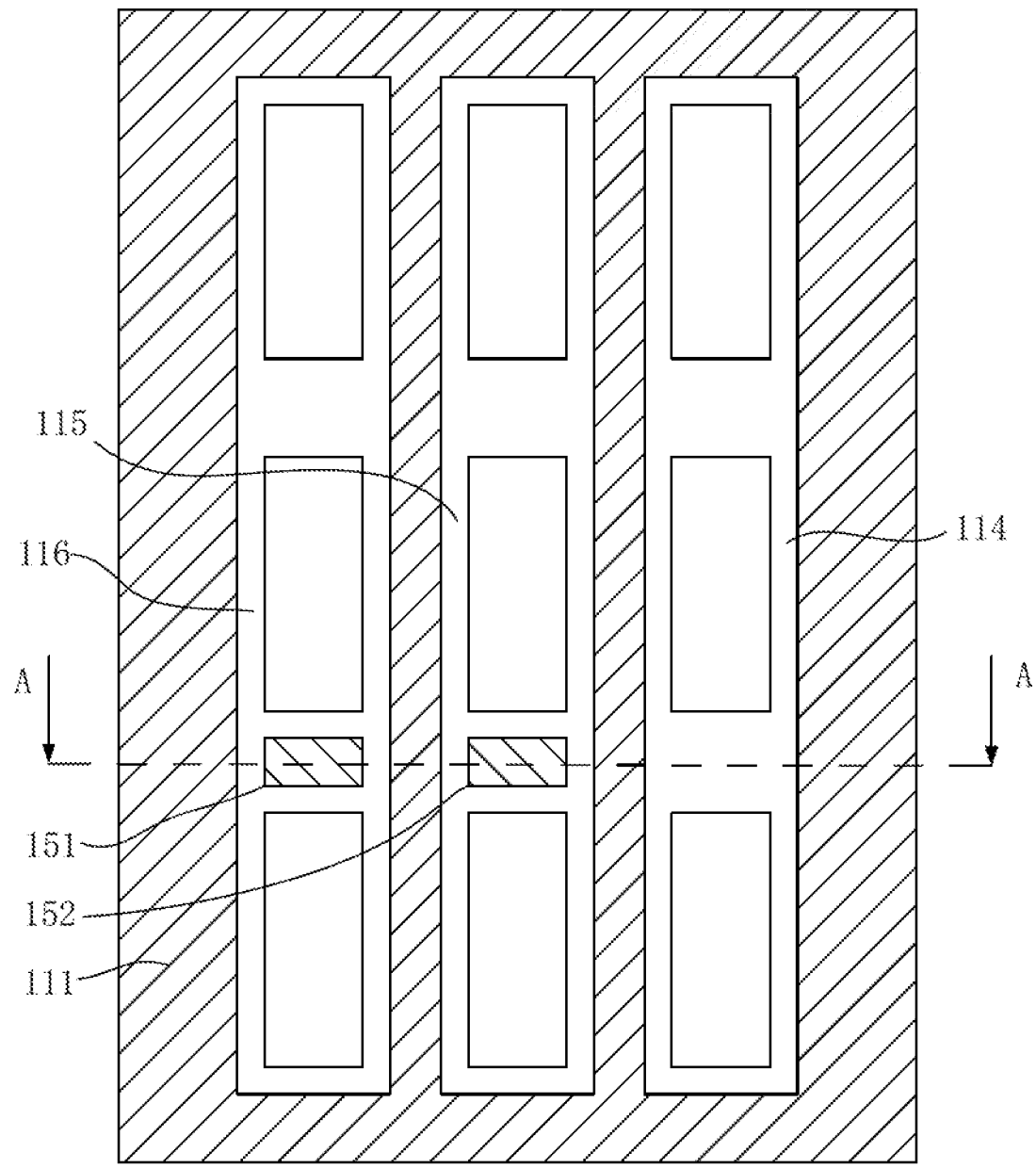
FIG. 1 is a top view of a liquid crystal cell of a display panel according to one embodiment of this application.

Specific structures and functional details disclosed herein are merely representative, and are intended to describe the objectives of the exemplary embodiments of this application. However, this application may be specifically implemented in many alternative forms, and should not be construed as being limited to the embodiments set forth herein.

In the description of this application, it should be understood that orientation or position relationships indicated by the terms such as "center", "transverse", "on", "below", "left", "right", "vertical", "horizontal", "top", "bottom" "inside", and "outside" are based on orientation or position relationships shown in the accompanying drawings, and are used only for ease and brevity of illustration and description, rather than indicating or implying that the mentioned apparatus or component must have a particular orientation or must be constructed and operated in a particular orientation. Therefore, such terms should not be construed as limiting of this application. In addition, the terms such as "first" and "second" are used only for the purpose of description, and should not be understood as indicating or implying the relative importance or implicitly specifying the number of the indicated technical features. Therefore, a feature defined by "first" or "second" can explicitly or implicitly include one or more of said features. In the description of this application, unless otherwise stated, "a plurality of" means two or more than two. In addition, the terms "include", "comprise" and any variant thereof are intended to cover non-exclusive inclusion.

In the description of this application, it should be noted that unless otherwise explicitly specified or defined, the terms such as "mount", "install", "connect", and "connection" should be understood in a broad sense. For example, the connection may be a fixed connection, a detachable connection, or an integral connection; or the connection may be a mechanical connection or an electrical connection; or the connection may be a direct connection, an indirect connection through an intermediary, or internal communication between two components. Persons of ordinary skill in the art may understand the specific meanings of the foregoing terms in this application according to specific situations.

The terminology used herein is for the purpose of describing specific embodiments only and is not intended to be limiting of exemplary embodiments. As used herein, the singular forms "a", "an" and "the" are intended to include the plural forms as well, unless the context clearly indicates otherwise. It should be further understood that the terms "include" and/or "comprise" when used in this specification, specify the presence of stated features, integers, steps, operations, elements, and/or components, but do not preclude the presence or addition of one or more other features, integers, steps, operations, elements, components, and/or combinations thereof.

In the drawings, units having similar structures are denoted by same reference numerals.

As shown in FIG. 1 to FIG. 6, the display panel, the mask for manufacturing same and the display device according to this application are described in one or more embodiments in detail.

Figure 2:
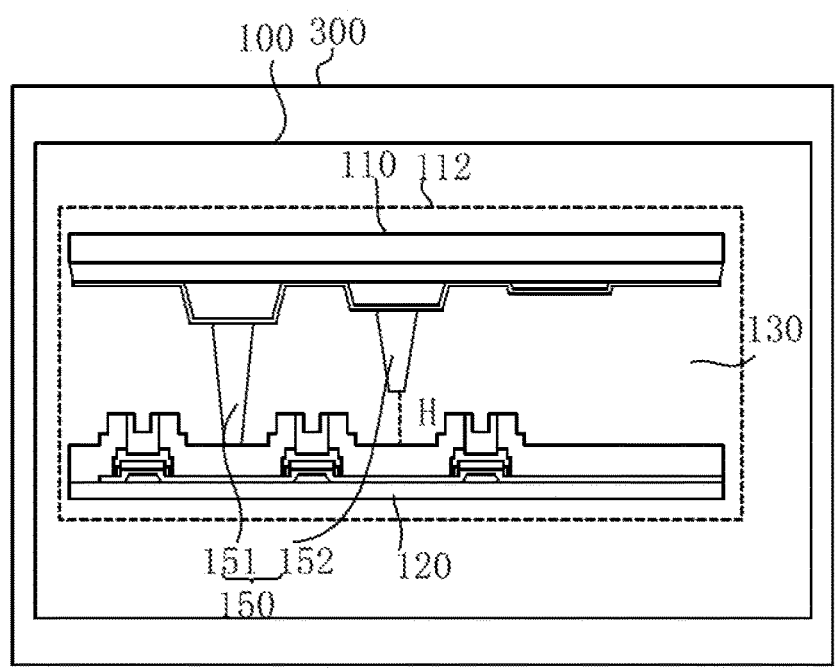
FIG. 2 is a sectional view of A-A in FIG. 1 according to one embodiment of this application.
Figure 4:
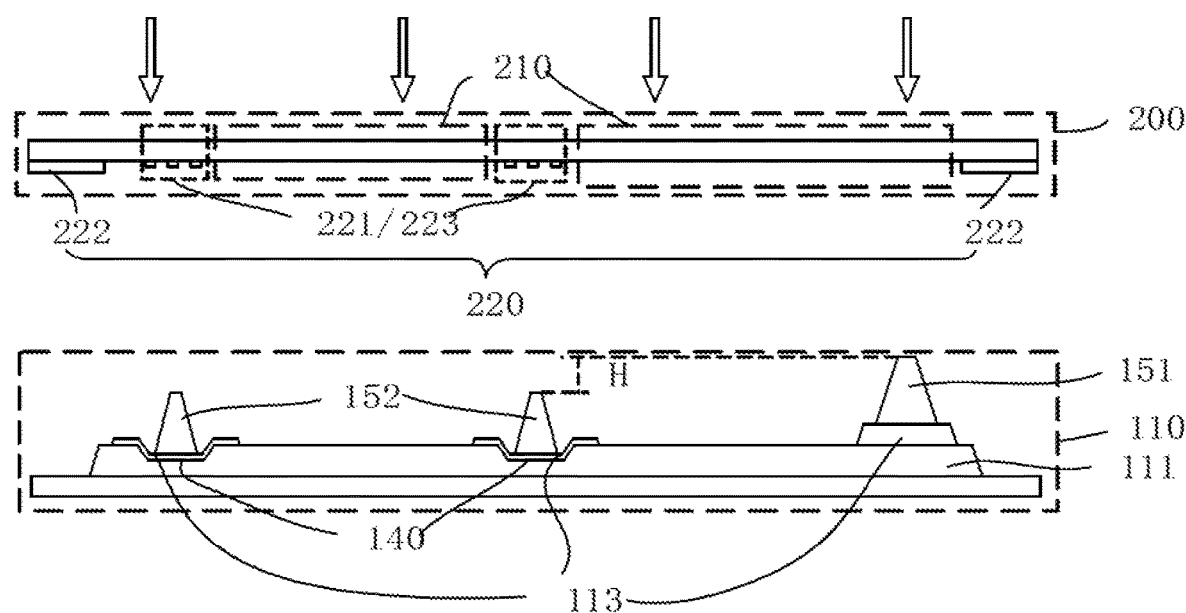
FIG. 4 is a schematic diagram of a depression provided on a photoresist layer and a black matrix layer according to one embodiment of this application.

As shown in FIG. 1, FIG. 2 and FIG. 4, a display panel 100 is provided. The display panel 100 includes a first substrate 110, a second substrate 120, a liquid crystal layer 130, a plurality of grooves 140, and a spacer 150. The second substrate 120 and the first substrate 110 are arranged correspondingly. The liquid crystal layer 130 is formed between the first substrate 110 and the second substrate 120. The plurality of grooves 140 are formed on the first substrate 110, the grooves 140 being depressed from the surface of the first substrate 110. The spacer 150 is formed on the first substrate 110 and arranged between the first substrate 110 and the second substrate 120. The spacer 150 includes a main spacer 151 and sub-spacers 152, the main spacer 151 being higher than the sub-spacers 152, and the sub-spacers 152 being located inside the grooves 140.

In this scheme, compared with the scheme as shown in FIG. 2, in the liquid crystal cell, there are two spacers: a main spacer maintaining the gap of the liquid crystal cell under normal circumstances, and a sub-spacer playing a supporting role only when being extruded by an external force. When the environment temperature rises, the main spacer plays a supporting role. When the temperature drops, the volume of liquid crystals shrinks, and the main spacer is further compressed. In this case, the sub-spacer also starts contacting and generates a supporting force. In view of the fact that the spacer 150 affects a liquid crystal cell 112, the main spacer 151 maintains the gap of the liquid crystal cell 112 and the sub-spacers 152 also play a supporting role during extrusion by an external force, a segment gap H between the main spacer and the sub-spacers may be increased in order to increase the liquid crystal redundancy of the liquid crystal cell 112. Therefore, according to this scheme, the grooves 140 are provided under the sub-spacers 152, so that the sub-spacers 152 are fixed into the grooves 140 to make the segment gap H with respect to the main spacer 151 increased, thus increasing the liquid crystal redundancy of the liquid crystal cell 112, and improving the phenomenon of gravity display brightness mura of the liquid crystal cell 112 due to a temperature variation.

As shown in FIG. 4, in one or more embodiments, the first substrate 110 includes a black matrix layer 111, the grooves 140 being provided on the black matrix layer 111. Here, the black matrix layer 111 may be replaced with different photoresist layers in an overlap manner.

In this scheme, the grooves 140 are provided on the black matrix layer 111, so that the sub-spacers 152 are arranged in the grooves 140. Because the manufacturing process of the black matrix layer 111 is convenient to control, the grooves 140 are simple and low in cost. Compared with the main spacer 151 that is not changed in height, the sub-spacers 152 are reduced in height, such that the segment gap H between the main spacer 151 and the sub-spacers 152 is increased.

As shown in FIG. 4, in one or more embodiments, the first substrate 110 includes a photoresist layer 113, the grooves 140 being provided on the photoresist layer 113.

In this scheme, the grooves 140 are provided on the photoresist layer 113 corresponding to the sub-spacers 152, so that the sub-spacers 152 are arranged in the grooves 140. The photoresist layer 113 corresponding to the main spacer 151 is not provided with the grooves 140, so that the height of the sub-spacers 152 is reduced, and the height of the main spacer 151 is not changed, thereby making the segment gap H between the main and sub-spacers increased.

As shown in FIG. 4, in one or more embodiments, the first substrate 110 includes a black matrix layer 111, the black matrix layer 111 being provided with a photoresist layer 113, and the grooves 140 being provided in an overlap region of the black matrix layer 111 and the photoresist layer 113.

In this scheme, in view of the fact that the spacer 150 is arranged on the photoresist layer 113 of the first substrate 110 and the photoresist layer 113 is arranged on, the black matrix layer 111, as long as the grooves 140 are provided in an overlap region of the black matrix layer 111 and the photoresist layer 113 in positional correspondence with the sub-spacers 152, the height of the sub-spacers 152 is reduced, and the position height of the main spacer 151 is not changed, so that a height difference between the main and sub-spacers is relatively increased to make the liquid crystal redundancy increased.

As shown in FIG. 1, in one or more embodiments, the first substrate 110 includes a photoresist layer 113, the photoresist layer 113 including a red photoresist layer 114, a green photoresist layer 115 and a blue photoresist layer 116, the grooves 140 being provided on the red photoresist layer 114 and the green photoresist layer 115.

In this scheme, the grooves 140 are provided on the red and green photoresist layers 113 corresponding to the sub-spacers 152, so that the sub-spacers 152 are arranged in the grooves 140. The blue photoresist layer 113 corresponding to the main spacer 151 is not provided with the grooves 140, so that the height of the sub-spacers 152 is reduced, and the height of the main spacer 151 is not changed, thereby making the segment gap H between the main and sub-spacers increased.

As shown in FIG. 1, FIG. 2 and FIG. 4, this application also discloses a display panel, including: a first substrate 110 and a second substrate 120, the second substrate 120 and the first substrate 110 being arranged oppositely; a liquid crystal layer 130, formed between the first substrate 110 and the second substrate 120; a plurality of grooves 140, formed on the first substrate 110, the grooves 140 being depressed from the surface of the first substrate 110; and a spacer 150, formed on the first substrate 110 and arranged between the first substrate 110 and the second substrate 120, the spacer 150 including a main spacer 151 and sub-spacers 152, the main spacer 151 being higher than the sub-spacers 152, and the sub-spacers 152 being located inside the grooves 140.

The first substrate 110 includes a black matrix layer 111 and a photoresist layer 113, the photoresist layer 113 being located on the black matrix layer 111, the grooves 140 including first grooves 141 and second grooves 142, the first grooves 141 being provided on the photoresist layer 113, the second grooves 142 being provided on the black matrix layer 111, and outer surfaces of the first grooves 141 fitting inner surfaces of the second grooves 142.

The sub-spacers 152 are located in the first grooves 141, and the main spacer 151 is located on the photoresist layer 113 without the grooves 140.

In this scheme, in view of the fact that the spacer 150 affects a liquid crystal cell 112, the main spacer 151 maintains the gap of the liquid crystal cell 112 and the sub-spacers 152 also play a supporting role during extrusion by an external force, a segment gap between the main spacer and the sub-spacers may be increased in order to increase the liquid crystal redundancy of the liquid crystal cell 112. Therefore, according to this scheme, the grooves 140 are provided under the sub-spacers 152, so that the sub-spacers 152 are fixed into the grooves 140 to make the segment gap with respect to the main spacer 151 increased, thus increasing the liquid crystal redundancy of the liquid crystal cell 112, and alleviating the phenomenon of gravity display brightness mura of the liquid crystal cell 112 due to a temperature variation. Because the spacer 150 is located on the photoresist layer 113 and the photoresist layer 113 is located on the black matrix layer 111, as long as the grooves 140 are provided on the photoresist layer 113 and the black matrix layer 111 at positions corresponding to the sub-spacers 152, the sub-spacers 152 are located in the grooves 140, which is equivalent to height reduction. The height of the main spacer 151 is not changed, so that the segment gap between the main and sub-spacers is increased, thus increasing the liquid crystal redundancy of the liquid crystal cell 112, and improving the phenomenon of gravity display brightness mura of the liquid crystal cell 112 due to a temperature variation.

As shown in FIG. 3 to FIG. 6, this application also discloses a mask 200 for manufacturing a display panel 100. The mask 200 includes a photic zone 210 and a shading zone 220. The shading zone 220 avoids from the photic zone 210, the light transmittance of the photic zone 210 being a hundred percent. The shading zone 220 includes a first shading zone 221 and a second shading zone 222, the first shading zone 221 being in positional correspondence with a groove 140, the light transmittance of the first shading zone 221 being greater than the light transmittance of the second shading zone 222, and the light transmittance of the second shading zone 222 being zero. This application adopts a negative photoresist for a film on the first substrate 110, a part receiving illumination is retained during exposure, and a part which does not receive exposure is etched off. The mask 200 adopts a graytone mask technology for the film on the first substrate 110.

In this scheme, because the film on the first substrate 110 adopts the negative photoresist and the graytone mask technology; a full shading zone is arranged correspondingly at a position where illumination does not need to be received; a photic zone 210 is arranged correspondingly at a position where exposure is needed but etching is not needed; a semi-photic zone 210 is arranged correspondingly at a position where etching is needed. Therefore, the first shading zone 221 in this scheme is the semi-photic zone 210, corresponding to the groove 140; the second shading zone 222 is a full shading zone, that is not photic; the photic zone 210 is a full shading zone 210, corresponding to the main spacer 151. Thus, the sub-spacers 152 are arranged in the grooves 140 and the main spacer 151 is arranged at a higher position, so that the segment gap H between the main and sub-spacers is increased, and the phenomenon of gravity display brightness mura of the liquid crystal cell 112 due to a temperature variation can be alleviated.

Figure 3:
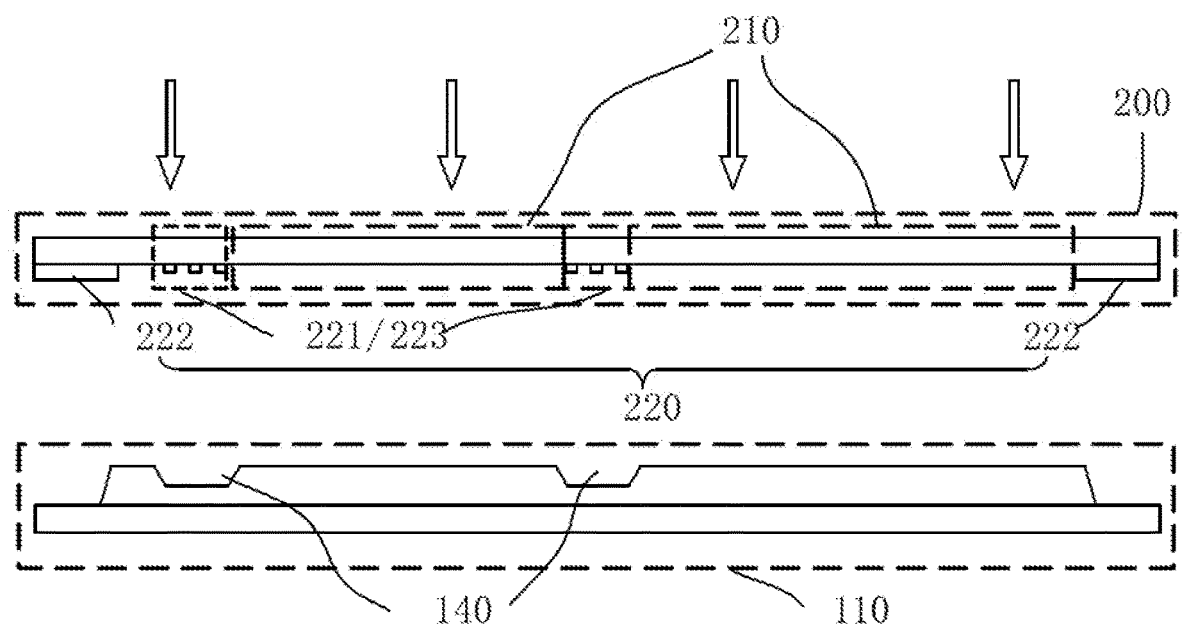
FIG. 3 is a schematic diagram of a depression made through a mask according to one embodiment of this application.

As shown in FIG. 3 and FIG. 4, in one or more embodiments, the first shading zone 221 is made of a partially-photic mask 223.

In this scheme, because the first shading zone 221 consists of a light blocking part and a photic part, the functions of the first shading zone 221 can be achieved by any mask that satisfies the structural function. Therefore, the first shading zone 221 in this scheme is made of a partially-photic mask 223.

Figure 5:
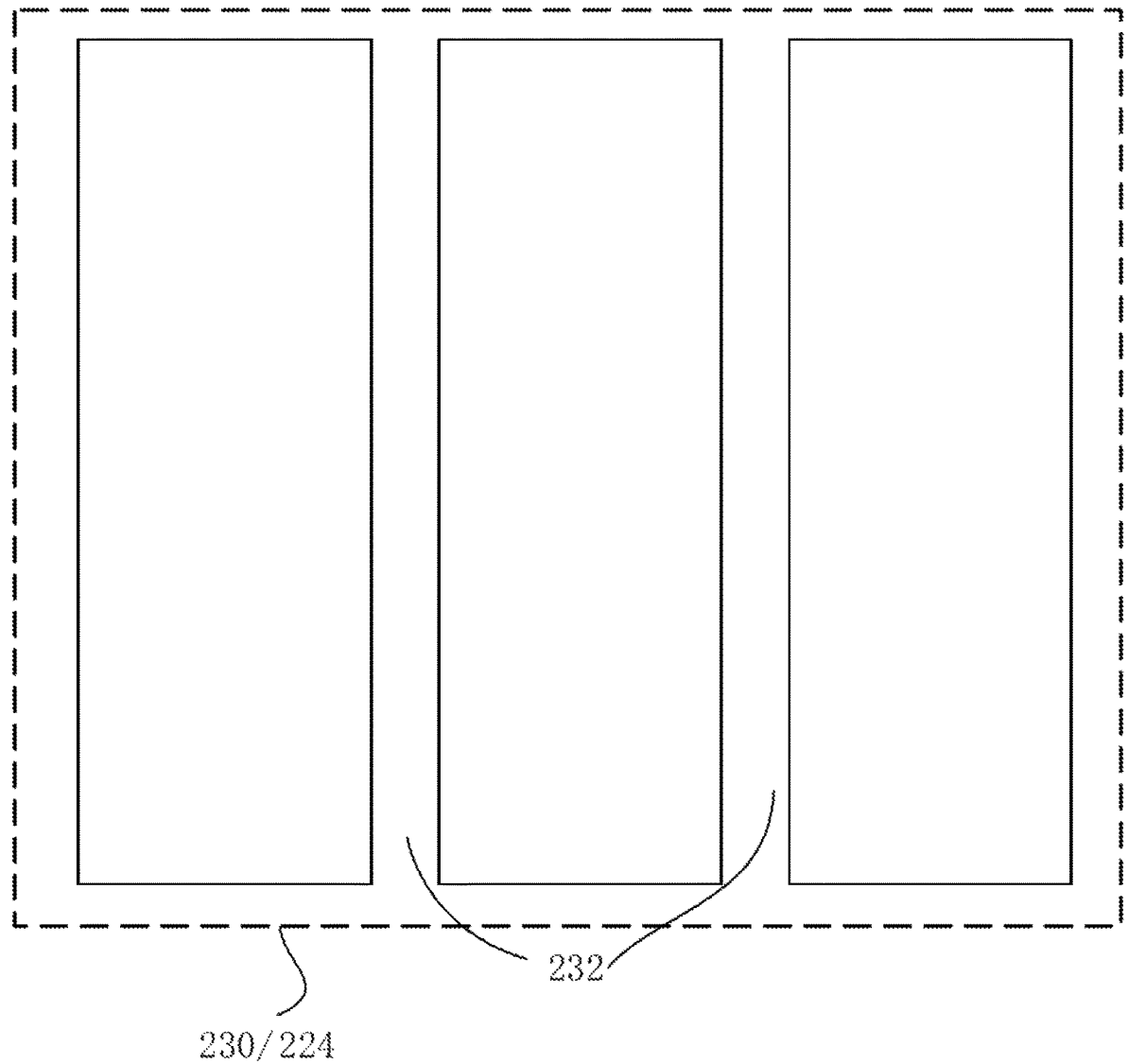
FIG. 5 is a schematic diagram of a strip-shaped metal shading layer according to one embodiment of this application.
Figure 6:
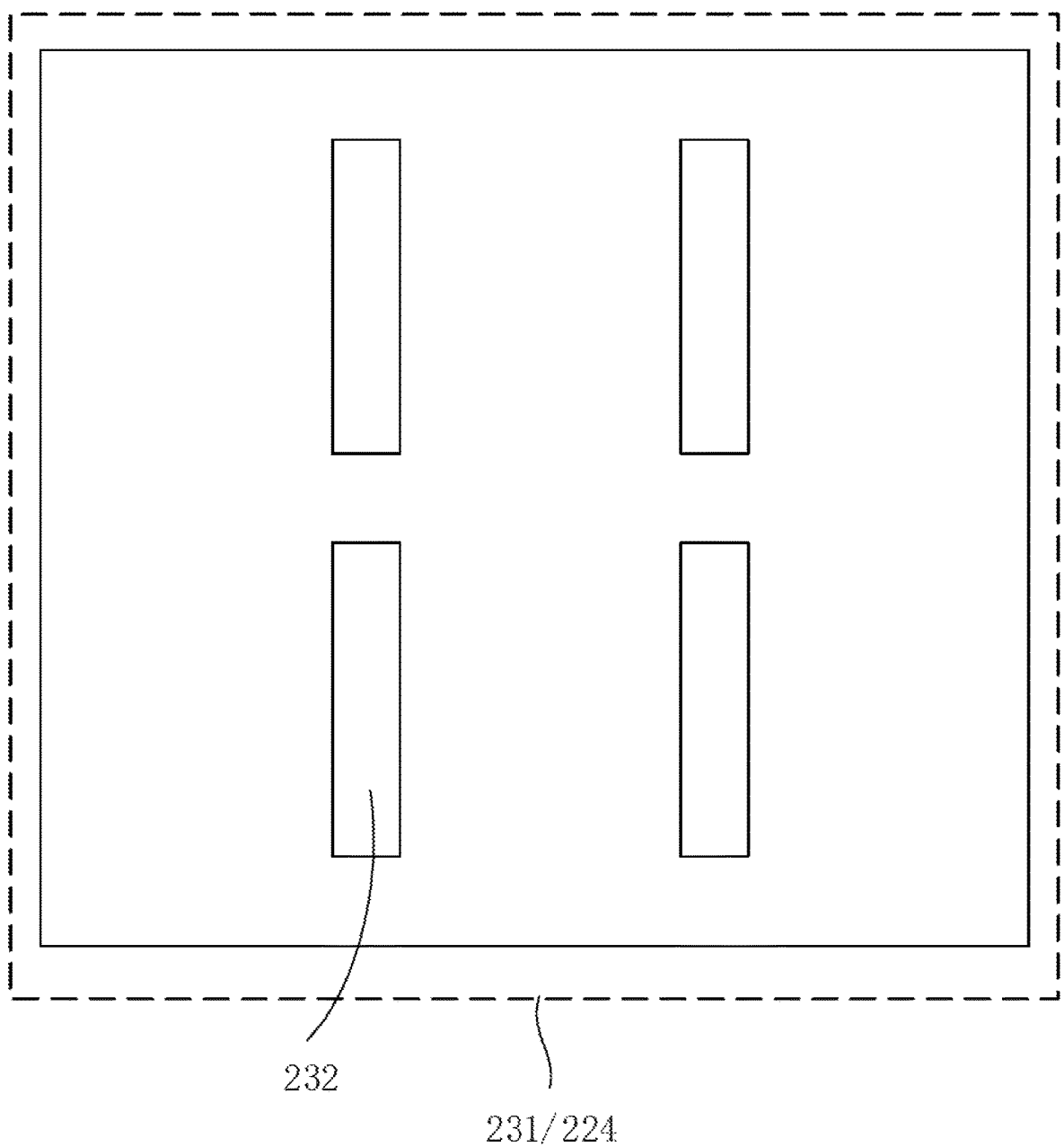
FIG. 6 is a schematic diagram of a mesh-shaped metal shading layer according to one embodiment of this application.

As shown in FIG. 5 and FIG. 6, in one or more embodiments, the first shading zone 221 is made of a hollowed-out metal layer 224.

In this scheme, because the first shading zone 221 is a partially-photic zone 210, a full shading part and a fully-photic part need to be provided. Therefore, the first shading zone 221 in this scheme is made of a hollowed-out metal layer 224. Due to the full shading property of metal itself, it is only necessary to hollow it out for light transmittance, and the grooves 140 may be made on the film on the first substrate 110.

As shown in FIG. 5 and FIG. 6, in one or more embodiments, the shape of the hollowed-out metal layer 224 is a strip 230 or a mesh 231, and may also be other shapes.

In this scheme, because the shape of the hollowed-out metal layer 224 is based on the requirements of the grooves 140, different grooves 140 usually correspond to different hollowed-out metal layers 224 in shape. Therefore, the hollowed-out shape of the hollowed-out metal layer 224 is a strip 230 or a mesh 231 or may be other shapes, which may correspondingly achieve the photic and shading functions.

As shown in FIG. 5 and FIG. 6, in one or more embodiments, the width of each hollowed-out grid in the hollowed-out metal layer 224 is greater than or equal to 1 μm and is less than or equal to 3 μm.

In this scheme, for a negative photoresist, a part which receives exposure is retained when being etched, the magnitude of exposure affects the film thickness of the retained part, the width of a hollowed-out gap 232 directly determines the magnitude of exposure, a width process of 1 μm or below is difficult to implement, a gap of 3 μm or above may receive a large light intensity, and a large segment gap H is difficult to implement. Therefore, the hollowed-out width in the hollowed-out metal layer 224 in this scheme is greater than or equal to 1 μm and less than or equal to 3 μm which may ensure a sufficient segment gap H between the main and sub-spacers.

In one or more embodiments, as shown in FIG. 5 and FIG. 6, each hollowed-out grid corresponding to the strip-shaped or mesh-shaped hollowed-out metal layer 224 is rectangular, where the width of the rectangle is smaller than or equal to the length, and the width of the rectangle is greater than or equal to 1 μm and is less than or equal to 3 μm.

In one or more embodiments, the metal layer is made of chromium (Cr), or may be made of chromium oxide, molybdenum silicide, nitrogen-containing zirconium silicide or nitrogen-containing molybdenum silicide.

In this scheme, the chromium layer plays a main role in shading light illumination, is light-proof, and does not directly react with etching gas, so that the functions of the first shading zone 221 can be satisfied, and it is environmentally friendly.

In one or more embodiments, the grooves 140 may be punched or not punched. It is recommended that the grooves are not punched. Otherwise, the filtering function of a color filter or the shading function of the black matrix layer 111 is affected.

As shown in FIG. 2 to FIG. 4, a display device 300 is disclosed. The display device 300 includes a display panel 100. The display panel 100 includes a first substrate 110, a second substrate 120, a liquid crystal layer 130, a plurality of grooves 140, and a spacer 150. The second substrate 120 and the first substrate 110 are arranged correspondingly. The liquid crystal layer 130 is formed between the first substrate 110 and the second substrate 120. The plurality of grooves 140 are provided on the first substrate 110, the grooves 140 being depressed from the surface of the first substrate 110. The spacer 150 is formed on the first substrate 110 and arranged between the first substrate 110 and the second substrate 120. The spacer 150 includes a main spacer 151 and sub-spacers 152, the main spacer 151 being higher than the sub-spacers 152, and the sub-spacers 152 being located inside the grooves 140.

In one or more embodiments, the first substrate 110 includes a black matrix layer 111, the grooves 140 being provided on the black matrix layer 111. Here, the black matrix layer 111 may be replaced with different photoresist layers in an overlap manner.

In one or more embodiments, the first substrate 110 includes a photoresist layer 113, the grooves 140 being provided on the photoresist layer 113.

In one or more embodiments, the first substrate 110 includes a black matrix layer 111, the black matrix layer 111 being provided with a photoresist layer 113, and the grooves 140 being provided m an overlap region of the black matrix layer 111 and the photoresist layer 113.

In one or more embodiments, the first substrate 110 includes a photoresist layer 113, the photoresist layer 113 including a red photoresist layer 114, a green photoresist layer 115 and a blue photoresist layer 116, the grooves 140 being provided on the red photoresist layer 114 and the green photoresist layer 115.

The foregoing content is merely detailed descriptions of this application made with reference to specific optional implementations, and should not be considered limiting of specific implementations of this application. Persons of ordinary skill in the art can further make simple deductions or replacements without departing from the concept of this application, and such deductions or replacements should all be considered as falling within the protection scope of this application.

What is claimed is:

1. A display panel, comprising:
   a first substrate;
   a second substrate, opposite to the first substrate;
   a liquid crystal layer, formed between the first substrate and the second substrate;
   a plurality of grooves having first grooves and second grooves, provided on the first substrate; and
   a black matrix layer deposited on the first substrate, the first grooves formed in the black matrix layer;
   a spacer, formed on the first substrate, and arranged between the first substrate and the second substrate,
   the spacer comprising a main spacer and a sub-spacer, the main spacer being higher than the sub-spacer, and the sub-spacer being located inside the groove;
   wherein the first substrate comprises a photoresist layer, the first grooves are covered by the photoresist layer;
   wherein the photoresist layer comprises a red photoresist layer, a green photoresist layer and a blue photoresist layer, the grooves being provided on the red photoresist layer and the green photoresist layer.

2. A display device, comprising a display panel, the display panel comprising:
   a first substrate;
   a second substrate, opposite to the first substrate;
   a liquid crystal layer, formed between the first substrate and the second substrate;
   a plurality of grooves having first grooves and second grooves, provided on the first substrate; and a black matrix layer deposited on the first substrate, the first grooves formed in the black matrix layer;

a spacer, formed on the first substrate, and arranged between the first substrate and the second substrate, the spacer comprising a main spacer and a sub-spacer, the main spacer being higher than the sub-spacer, and the sub-spacer being located inside the groove;

wherein the first substrate comprises a photoresist layer, the first grooves are covered by the photoresist layer;

wherein the photoresist layer comprises a red photoresist layer, a green photoresist layer and a blue photoresist layer, the grooves being provided on the red photoresist layer and the green photoresist layer.

3. The display panel according to claim 1, wherein the photoresist layer is disposed corresponding to the main spacer and the sub-spacer, and there is no photoresist layer in other area.

4. The display panel according to claim 1, wherein a thickness of the photoresist layer corresponding to sub-spacer is less than a thickness of the photoresist layer corresponding to the main spacer.

5. The display panel according to claim 1, wherein the second grooves are provided on the photoresist layer, and side surfaces of the photoresist layer fit bottoms of the first grooves, the sub-spacer is located in the second grooves, and the main spacer is located on the photoresist layer without the grooves.

* * * * *